: United States Patent  (10) Patent No.: US 9,105,716 B2
Akiyama et al. (45) Date of Patent: Aug. 11, 2015

(54) SEMICONDUCTOR DEVICE

(75) Inventors: Miwako Akiyama, Tokyo (JP); Yusuke Kawaguchi, Kanagawa-ken (JP); Yoshihiro Yamaguchi, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1309 days.

(21) Appl. No.: 12/944,632

(22) Filed: Nov. 11, 2010

(65) Prior Publication Data

US 2011/0059586 A1 Mar. 10, 2011

Related U.S. Application Data

(62) Division of application No. 12/332,260, filed on Dec. 10, 2008, now Pat. No. 7,872,308.

(30) Foreign Application Priority Data

Dec. 10, 2007 (JP) ................................. 2007-318044

(51) Int. Cl.
*H01L 21/336* (2006.01)
*H01L 29/78* (2006.01)
*H01L 29/06* (2006.01)
*H01L 29/10* (2006.01)
*H01L 29/66* (2006.01)
(Continued)

(52) U.S. Cl.
CPC ........ *H01L 29/7813* (2013.01); *H01L 29/0634* (2013.01); *H01L 29/1095* (2013.01);
(Continued)

(58) Field of Classification Search
None
See application file for complete search history.

(56) References Cited

U.S. PATENT DOCUMENTS 8,680,611 B2 * 3/2014 Kocon et al. ................ 257/330
2001/0005031 A1 6/2001 Sakamoto et al.
(Continued)

FOREIGN PATENT DOCUMENTS

JP 2001168327 A 6/2001
JP 2004-072068 3/2004
(Continued)

OTHER PUBLICATIONS

Japanese Office Action dated Oct. 16, 2012 filed in Japanese Counterpart Application No. 2007-318044, 6 pages.

*Primary Examiner* — Matthew W Such
*Assistant Examiner* — Abul Kalam
(74) *Attorney, Agent, or Firm* — Patterson & Sheridan, LLP

(57) ABSTRACT

A semiconductor device includes: a first semiconductor layer of a first conductivity type; a second semiconductor layer of the first conductivity type provided on a main surface of the first semiconductor layer and having a lower impurity concentration than that of the first semiconductor layer; a third semiconductor layer of a second conductivity type provided on the second semiconductor layer; a fourth semiconductor layer of the first conductivity type selectively provided on the third semiconductor layer; a gate electrode provided in a trench passing through the third semiconductor layer and reaching the second semiconductor layer; a first main electrode contacting the fourth semiconductor layer and contacting the third semiconductor layer through a contact groove provided to pass through the fourth semiconductor layer between the contiguous gate electrodes; a second main electrode provided on an opposite surface to the main surface of the first semiconductor layer; and a fifth semiconductor layer of the second conductivity type provided in an interior portion of the second semiconductor layer corresponding to a part under the contact groove. An uppermost portion of the fifth semiconductor layer contacts the third semiconductor layer, a lowermost portion of the fifth semiconductor layer has a higher impurity concentration than that of the other portion in the fifth semiconductor layer and is located in the second semiconductor layer and not contacting the first semiconductor layer, and the fifth semiconductor layer is narrower from the uppermost portion to the lower most portion.

7 Claims, 10 Drawing Sheets

(51) Int. Cl.
  *H01L 21/265* (2006.01)
  *H01L 29/08* (2006.01)
  *H01L 29/417* (2006.01)

(52) U.S. Cl.
  CPC .... *H01L29/66727* (2013.01); *H01L 29/66734* (2013.01); *H01L 21/26586* (2013.01); *H01L 29/0869* (2013.01); *H01L 29/41741* (2013.01); *H01L 29/41766* (2013.01)

(56) References Cited

U.S. PATENT DOCUMENTS

2003/0060013 A1* 3/2003 Marchant et al. ............. 438/270
2005/0139909 A1   6/2005 Miura
2006/0076614 A1   4/2006 Ninomiya
2006/0214221 A1*  9/2006 Challa et al. ................. 257/328
2006/0244054 A1* 11/2006 Kobayashi ................... 257/329
2006/0244056 A1  11/2006 Miura
2006/0267090 A1* 11/2006 Sapp et al. ................... 257/341
2007/0001194 A1*  1/2007 Ono et al. .................... 257/127
2007/0114599 A1   5/2007 Hshieh
2008/0099837 A1   5/2008 Akiyama et al.

FOREIGN PATENT DOCUMENTS

JP   2005191268 A   7/2005
JP   2006-179598     7/2006

* cited by examiner

US 9,105,716 B2

SEMICONDUCTOR DEVICE

CROSS-REFERENCE TO RELATED APPLICATIONS

This application is a divisional of U.S. patent application Ser. No. 12/332,260, filed Dec. 10, 2008, which is based upon and claims the benefit of priority from the prior Japanese Patent Application No.2007-318044, filed on Dec. 10, 2007; the entire contents of which are incorporated herein by reference.

BACKGROUND OF THE INVENTION

This invention relates to a semiconductor device.

Low-breakdown-voltage MOSFET (Metal-Oxide-Semiconductor Field Effect Transistor) has been wildly used in a notebook computer, an AC adapter of LCD (Liquid Crystal Display), a switching power source of the server, or the like, and lower ON resistance and higher speed have been required. In the low-breakdown-voltage MOSFET, the percentage of the ON resistance depending on the channel resistance is high, and therefore, the ON resistance has been reduced by miniaturization or the like. And, along with realizing reduction of the channel resistance, reduction of drift resistance has also been taken attention to.

One example of the structure reducing the drift resistance includes so-called "Super Junction Structure" which has actual performance in high breakdown voltage and in which the pn junction structure parts are provided repeatedly in the horizontal direction in the drift layer (for example, JP-A 2006-179598 (Kokai),). Moreover, in the low breakdown voltage system, in so-called "Semi Super Junction Structure" provided with p-type pillar layer to the midstream of the depth direction of n-type drift layer, it is reported that reduction of ON resistance is realized and trade-off between breakdown voltage and ON resistance is improved.

SUMMARY OF THE INVENTION

According to an aspect of the invention, there is provided a semiconductor device including: a first semiconductor layer of a first conductivity type; a second semiconductor layer of the first conductivity type provided on a main surface of the first semiconductor layer and having a lower impurity concentration than that of the first semiconductor layer; a third semiconductor layer of a second conductivity type provided on the second semiconductor layer; a fourth semiconductor layer of the first conductivity type selectively provided on the third semiconductor layer; a gate electrode provided in a trench passing through the third semiconductor layer and reaching the second semiconductor layer; a first main electrode contacting the fourth semiconductor layer and contacting the third semiconductor layer through a contact groove provided to pass through the fourth semiconductor layer between the contiguous gate electrodes; a second main electrode provided on an opposite surface to the main surface of the first semiconductor layer; and a fifth semiconductor layer of the second conductivity type provided in an interior portion of the second semiconductor layer corresponding to a part under the contact groove, an uppermost portion of the fifth semiconductor layer contacting the third semiconductor layer, a lowermost portion of the fifth semiconductor layer having a higher impurity concentration than that of the other portion in the fifth semiconductor layer and being located in the second semiconductor layer and not contacting the first semiconductor layer, and the fifth semiconductor layer being narrower from the uppermost portion to the lower most portion.

According to another aspect of the invention, there is provided A method for producing a semiconductor device, including: forming a structure in which a trench gate structure is provided in a front surface side of semiconductor layers in which on a main surface of a first semiconductor layer of a first conductivity type, a second semiconductor layer of the first conductivity type that has a lower impurity concentration than that of the first semiconductor layer, a third semiconductor layer of a second conductivity type, and a fourth semiconductor layer of the first conductivity type are sequentially provided; forming a contact groove passing through the fourth semiconductor layer in the contiguous trench gate structures and reaching the third semiconductor layer; and forming a fifth semiconductor layer by introducing an impurity of the second conductive type into the second semiconductor layer by a plurality of times sequentially from a first introduction position in the second semiconductor layer not reaching the main surface of the first semiconductor layer to a shallower position therein in the third semiconductor layer side so that the fourth semiconductor layer in which the contact grooves are selectively formed serves as a mask, the fifth semiconductor layer being thinner from the uppermost portion to the lowermost portion, and a dose amount in impurity introduction into the first introduction position being higher than a dose amount of impurity introduction into the shallower position than the first introduction position.

DETAILED DESCRIPTION OF THE INVENTION

Hereinafter, embodiments of this invention will be explained with reference to drawings. In the embodiments shown in the following, vertical MOSFET (Metal-Oxide- Semiconductor Field Effect Transistor) in which a main current pathway is formed in the gate-on case in the vertical direction connecting a first main electrode provided in the front surface side of the semiconductor structure part in which, for example, silicon is used as the semiconductor material and a second main electrode provided in the back surface side that is the opposite side of the front surface provided with the first electrode will be cited as an example and explained. Moreover, in the following embodiments, the first conductivity type is set to be n type, and the second conductivity type is set to be p type, and the explanation will be performed.

First Embodiment

Figure 1:
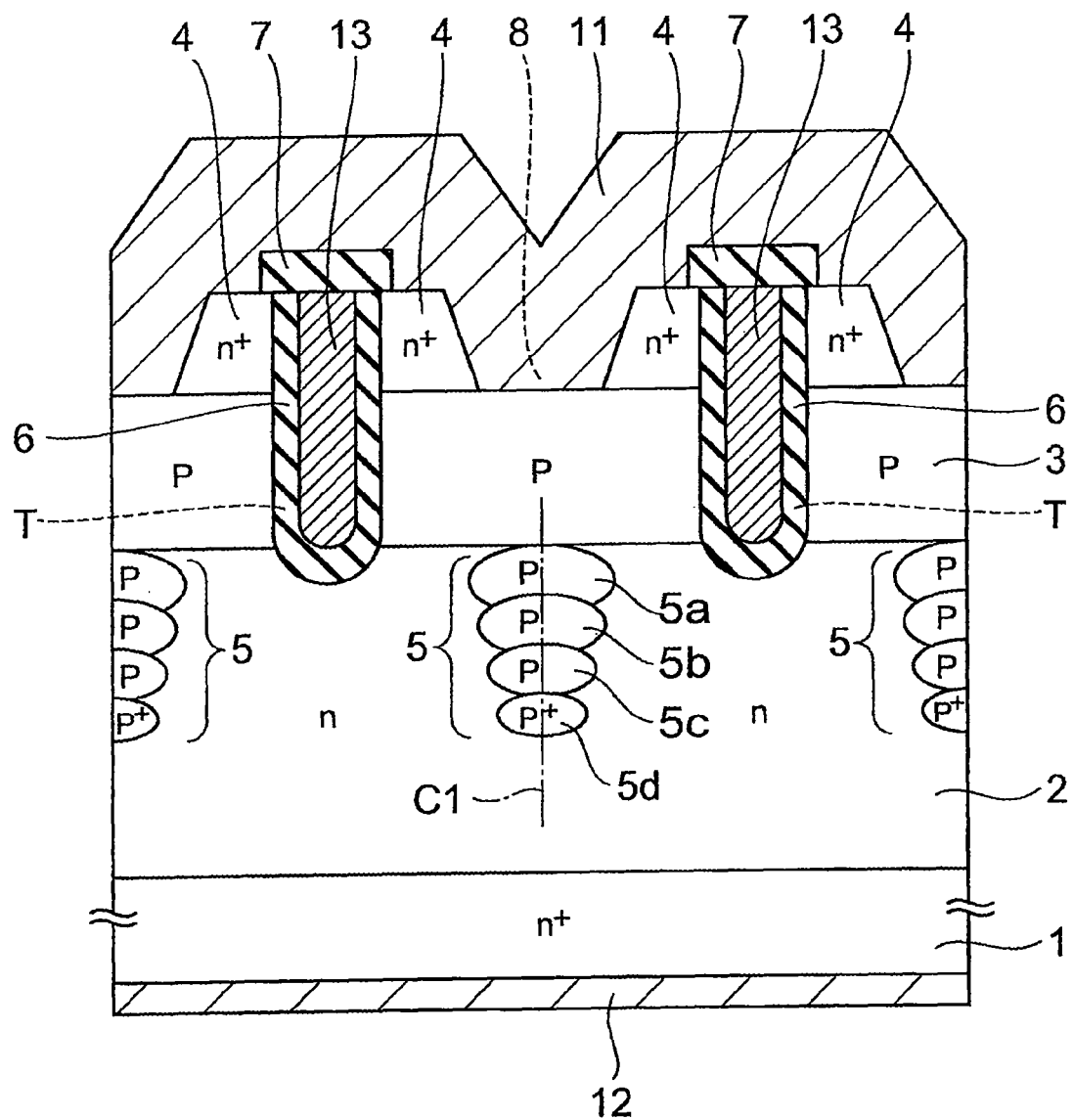
FIG. 1 is a schematic view showing a sectional structure of a semiconductor device according to a first embodiment of this invention.

FIG. 1 is a schematic view showing a sectional structure of the semiconductor device according to a first embodiment of this invention.

The semiconductor according to this embodiment is a vertical MOSFET of trench gate type in which a trench gate structure is provided on a front surface side of the semiconductor layers in which on a main surface of an $n^+$-type drain layer (or semiconductor substrate) as a first semiconductor layer, an n-type drift layer 2 as a second semiconductor layer having a lower impurity concentration than that of the drain layer 1, a p-type base layer 3 as a third semiconductor layer, and an $n^+$-type source layer 4 as a fourth semiconductor layer having a higher impurity concentration than that of the drift layer 2 are sequentially provided.

The drift layer 2 is epitaxially grown on the main surface of the drain layer 1, and the base layer 3 is provided on (the surface part of) the drift layer 2, and the source layer 4 is selectively provided on (the surface part of) the base layer 3.

A plurality of trenches T passing from the surface of the source layer 4 through the base layer 3 and reaching the drift layer 2 are formed separately to each other, and a gate electrode 13 is provided through a gate insulator film 6 in each of the trenches T, and the trench gate structure is composed. The trench gate structure is provided in a stripe shape extending to the direction passing through the page.

The gate insulator film 6 is, for example, a silicon oxide film and formed between the gate electrode 13 and the trench T bottom portion and between the gate electrode 13 and the trench T side wall. The base layer 3 is opposed to the gate electrode 13 through the gate insulator film 6. On the gate electrode 13 and the trench T, an interlayer insulator film (for example, silicon oxide film) 7 is provided.

A source electrode 11 as the first electrode is provided so as to cover the source layer 4 on the base layer 3. The source electrode 11 has ohmic contact with the source layer 4, and the source layer 4 is electrically connected to the source electrode 11.

Moreover, the source electrode 11 is also provided in a contact groove 8, and contacts the surface of the base layer 3 through the portion thereof. The contact groove 8 is formed to pass through the source layer 4 between the contiguous gate electrodes 13, and width thereof is narrower as the depth to the base layer 3 is larger. The side surface of the source layer 4 surrounding the circumference of the contact groove 8 is inclined so that the distance between the opposed side surfaces of the source layers 4 is gradually shorter as the depth thereof is larger, the sectional shape of the contact groove 8 is an inverted trapezoid as shown in FIG. 1. That is, width of the contact groove 8 is gradually narrowed continuously as the depth thereof is larger.

The surface part contacting the source electrode 11 in the base layer 3 is set to be $p^+$-type having higher impurity concentration than that of the other part of the base layer 3, and the base layer 3 and the source electrode 11 have ohmic contact, and the base layer 3 is set to have a source potential.

A p-type pillar layer (or buried diffusion layer) 5 as a fifth semiconductor layer is provided in an interior portion of the drift layer 2 corresponding to a part under the contact groove 8 between the contiguous gate electrodes 13.

The p-type pillar layer 5 is formed by a plurality of times of implantation of p-type impurity (such as boron) and heat treatment after the implantation before forming the source electrode 11 so that the source layer 4 and the trench gate structure in which the contact grooves 8 are selectively formed serve as a mask.

In an example shown in FIG. 1, for example, four times of ion implantation are performed, but the number of the times is not limited thereto. A lower most portion 5d of the p-type pillar layer 5 is formed by diffusing, by heat treatment, p-type impurity implanted into the drift layer 2 by the first ion implantation, and an upper portion 5c thereof is formed by diffusing, by heat treatment, p-type impurity implanted into a shallower position than the first implantation position in the drift layer 2 by the second ion implantation, and an upper portion 5b thereof is formed by diffusing, by heat treatment, p-type impurity implanted into a shallower position than the second implantation position in the drift layer 2 by the third ion implantation, and an uppermost portion 5a is formed by diffusing, by heat treatment, p-type impurity implanted into a shallower position than the third implantation position in the drift layer 2 by the fourth ion implantation.

The uppermost portion 5a of the p-type pillar layer 5 contacts the base layer 3 and the lower portion 5b thereof contacts the uppermost portion 5a, and the lower portion 5c thereof contacts the portion 5b and the lowermost portion 5d, and each of the portions are connected in the depth direction (vertical direction) in the drift layer 2.

The lowermost portion 5d of the p-type pillar layer 5 is located in the drift layer 2 and does not contact the drain layer 1. There is a drift layer 2 between the lowermost portion 5d of the p-type pillar layer 5 and the drain layer 1. Moreover, the lowermost portion 5d has a higher impurity concentration than those of the other portions 5a to 5c in the p-type pillar layer 5.

The n-type pillar layer and the p-type pillar layer 5 are alternately and periodically arranged in the horizontal direction that is about perpendicular to the vertical direction in which the main current pathway is formed in ON (about parallel direction to the main surface of the drain layer 2), and thereby, so-called "Super Junction Structure" is composed. For example, n-type pillar layer and the p-type pillar layer 5 have stripe-shaped planer patterns.

The p-type pillar layer 5 is narrower in a stepwise manner from the uppermost portion 5a to the lowermost portion 5d (as the depth is larger). That is, in the uppermost portion 5a, diffusion distance in the horizontal direction of p-type impurity is the largest, and from the lower portion 5b thereof to the lowermost portion 5d, the diffusion distance in the horizontal direction of p-type impurity is smaller in a stepwise manner.

In the back surface in the opposite side to the main surface of the drain layer 1, the drain electrode 12 as the second main electrode is provided, and the drain layer 1 is electrically connected to the drain electrode 12. The gate electrode 13 is electrically connected to a gate pad through a gate-electrode-drawing part, which is not shown.

In the semiconductor device composed as described above, when a predetermined gate voltage is applied to the gate electrode 13, an inversion layer (channel) is formed in the base layer 3 opposed to the gate electrode 13 through the gate insulator film 6, and a main current flows in the vertical direction between the source electrode 11 and the drain electrode 12 through the source layer 4, the channel, the drift layer 2, and the drain layer 1 (It becomes in ON state).

The semiconductor device according to this embodiment has so-called "Semi Super Junction Structure" in which p-type pillar layers 5 are provided in the drift layer 2 from the interface between the base layer 3 and the drift layer 2 (pn junction plane) to the depth of the midstream of the drift layer 2 and the repeated structure of pn junction is formed in the horizontal direction of the drift layer 2. By this structure, when high voltage is applied to the drain electrode 12 in OFF, the depletion layer spreads to the horizontal direction from the pn junction plane between the drift layer 2 and the p-type pillar layer. Compared to the structure having no p-type pillar layer 5 in which the depletion layer spreads only from the pn junction plane between the base layer 3 and the drift layer 2, when the same drain voltage is applied, the depletion layer spreading to the drift layer 2 is larger, and higher breakdown voltage can be obtained.

The semi super junction structure in which the p-type pillar layer is provided only to the depth of midstream of the drift layer 2 can be obtained more easily and at lower cost, compared to the structure in which p-type pillar layer 5 is provided over the entirety of the thickness (depth) direction of the drift layer 2.

In such a semi super junction structure, by setting the impurity concentration of the lowermost portion 5d to be higher than those of the other portions 5a to 5c in the p-type pillar layer 5, the depletion more easily spreads from the pn junction between the lowermost potion 5d and the drift layer 2 to the lower direction (into the drift layer 2), and thereby, the structure can have higher breakdown voltage.

The pillar layer 5 is obtained by stacking, in vertical direction, a plurality of impurity diffusion layers obtained by a plurality of times of ion implantation and heat treatment after the implantation, and in this case, impurity dose amount in the first ion implantation for forming the lowermost portion 5d can be set to be higher than the impurity dose amounts in the second or later ion implantation, and thereby, the impurity concentration of the lowermost portion 5d can be higher than those of the other part 5a to 5c.

When the impurity diffusion layer is formed by ion implantation by using the same mask, as the dose amount is higher, the widths of horizontal and vertical directions of the formed impurity diffusion layer are larger. Therefore, if it is attempted that only the lowermost portion of the p-type pillar layer is set to be high by ion implantation by using the same mask, the width of a lowermost portion 55a of a p-type pillar layer 55 is larger than that of the other portion in the p-type pillar layer 55, like as a first comparative example shown in FIG. 9.

Figure 9:
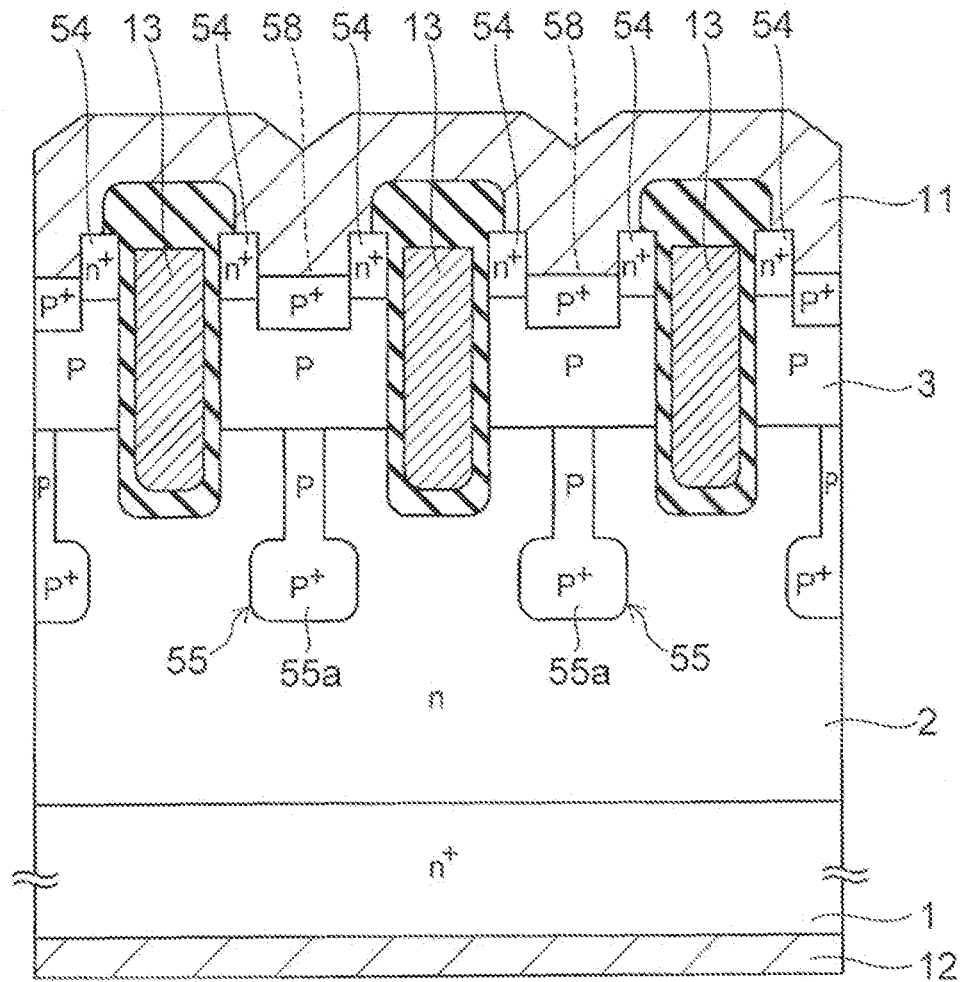
FIG. 9 is a schematic view showing a sectional structure of a semiconductor device of the first comparative example.

Out of each of the components of the first comparative example shown in FIG. 9, the same signs are appended to the same components as the components of the semiconductor device according to the first embodiment of the invention shown in FIG. 1. Moreover, the side surface of a source layer 54 in the first comparative example is not inclined, and namely, a contact groove 58 does not have a shape whose width is narrower as the depth thereof is larger like the first embodiment, and the contact groove 58 has about constant width.

As the first comparative example shown in FIG. 9, if the width of the lowermost portion 55a of the p-type pillar layer 55 is wide, a part of the current pathway in the drift layer 2 becomes narrow by the amount thereof and ON resistance comes to increase.

By contrast, in this embodiment, by the process to be described later (ion implantation) utilizing the contact groove 8 whose width is narrower as the depth is larger, even if the dose amount in the ion implantation is enhanced to make the lowermost portion 5d have a high impurity concentration, the p-type pillar layer 5 that is narrower in a stepwise manner as the depth is larger can be formed.

As a result, by setting the impurity concentration of the lowermost portion 5d of the p-type pillar layer 5 to be higher than the other portions 5a to 5c, the depletion layer more easily spread from the pn junction between the lowermost portion 5d and the drift layer 2 to the lower direction, and the structure has higher breakdown voltage, and by suppressing the constriction of the current pathway in the drift layer 2, increase of ON resistance can be suppressed.

Figure 2:
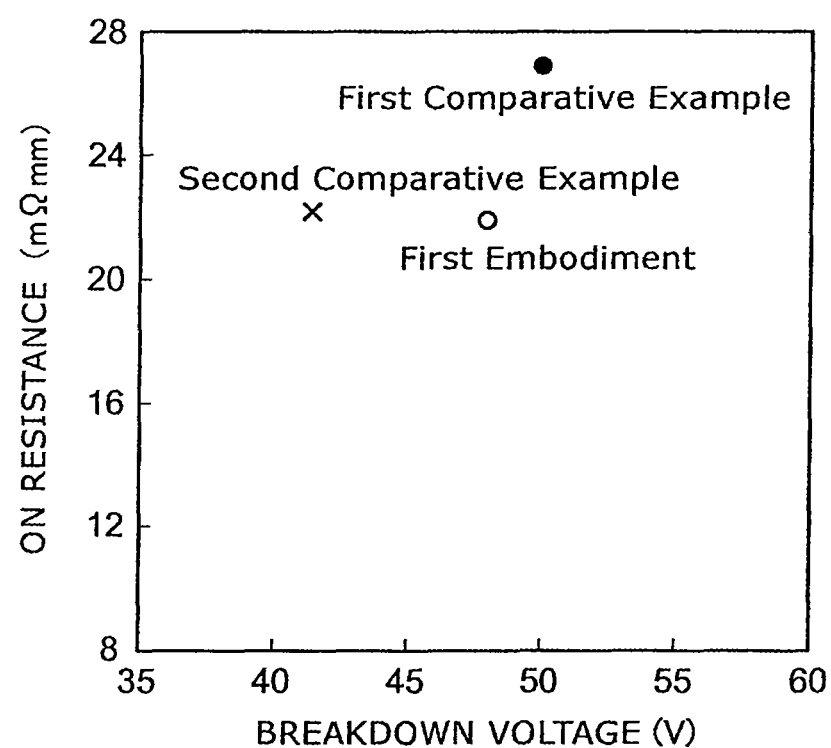
FIG. 2 is a graph showing the relation of the on-resistance and the breakdown voltage for a first embodiment of the invention, a first comparative example and a second comparative example.
Figure 10:
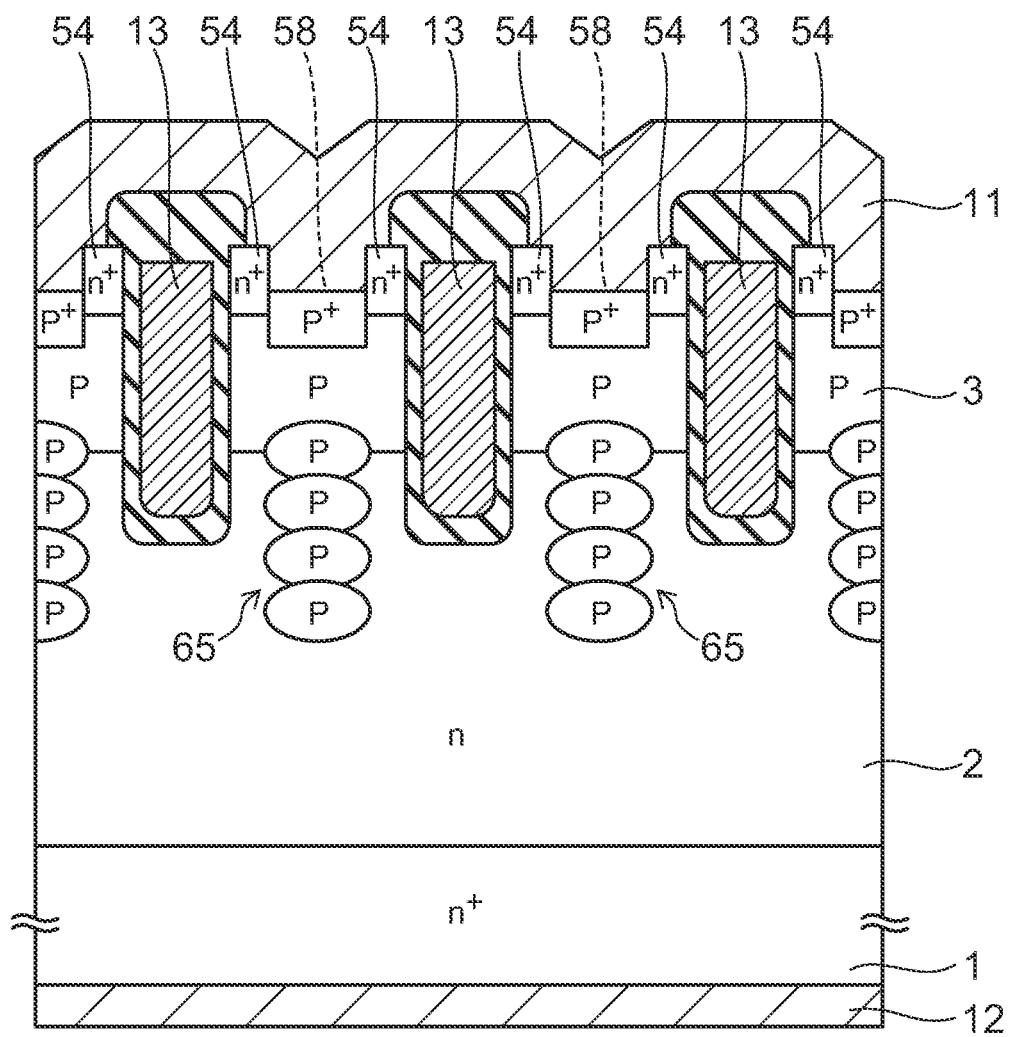
FIG. 10 is a schematic view showing a sectional structure of a semiconductor device of the second comparative example.

In FIG. 2, with respect to the first embodiment shown in FIG. 1 and the first comparative example shown in FIG. 9 and the second comparative example shown in FIG. 10, the simulation calculation result of breakdown voltage (V) and ON resistance (mΩmm). In FIG. 2, white circle (○) represents the result of the first embodiment, and black circle (●) represents the result of the first comparative embodiment, and x-mark (X) represents the result of the second comparative example.

In the first comparative example shown in FIG. 9, by ion implantation by using the same mask, the lowermost portion 55a of the p-type pillar layer 55 is formed and the dose amount in the ion implantation is enhanced, and the structure in which the impurity concentration of the lowermost portion 55a is higher than the other portion, and the width of the lowermost portion 55a spreads and a part of current pathway in the drift layer 2 is narrowed.

In the structure of the second comparative example shown in FIG. 10, a plurality of times of ion implantation are performed so that the dose amounts are constant, and a p-type pillar layer 65 is formed, and the width of the p-type pillar layer 65 and the impurity concentration are about constant in the depth direction. Moreover, the impurity concentration in the p-type pillar layer 65 of this second comparative example is set to have the concentration when the breakdown voltage becomes maximum.

From the result of FIG. 2, the breakdown voltage of the first embodiment of the invention in which the impurity concentration in the lowermost portion of the p-type pillar layer has higher breakdown voltage than that of the second comparative example. Moreover, when the first embodiment and the first comparative example are compared, the breakdown voltage of the first embodiment is lower than that of the first comparative example, but ON resistance of the first embodiment is lower than that of the first comparative example. Therefore, by the structure of the first embodiment, the trade-off between the breakdown voltage and the ON resistance is improved, and both of higher breakdown voltage and lower ON resistance can be achieved.

Figure 3A:
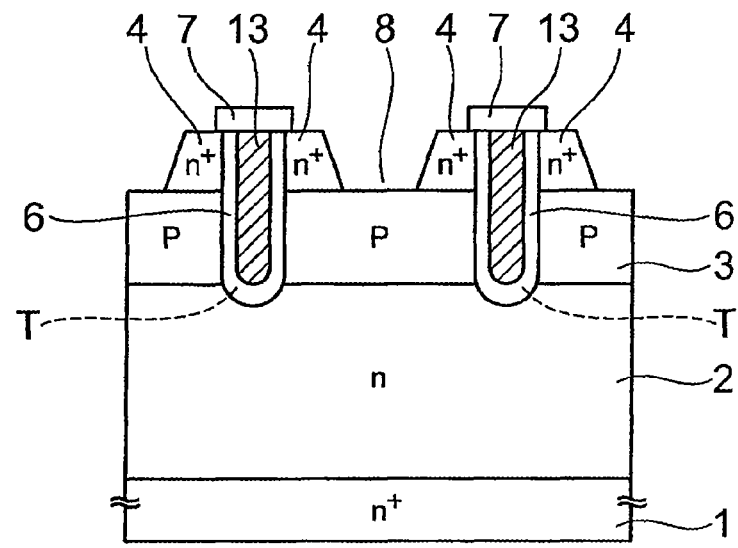
FIGS. 3A to 3C are process cross-sectional views showing a method for producing the semiconductor device according to the first embodiment.
Figure 3B:
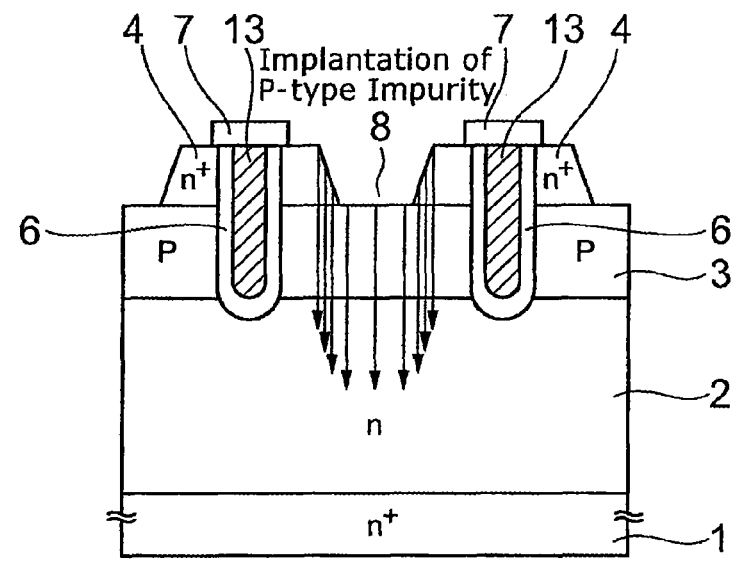
Figure 3C:
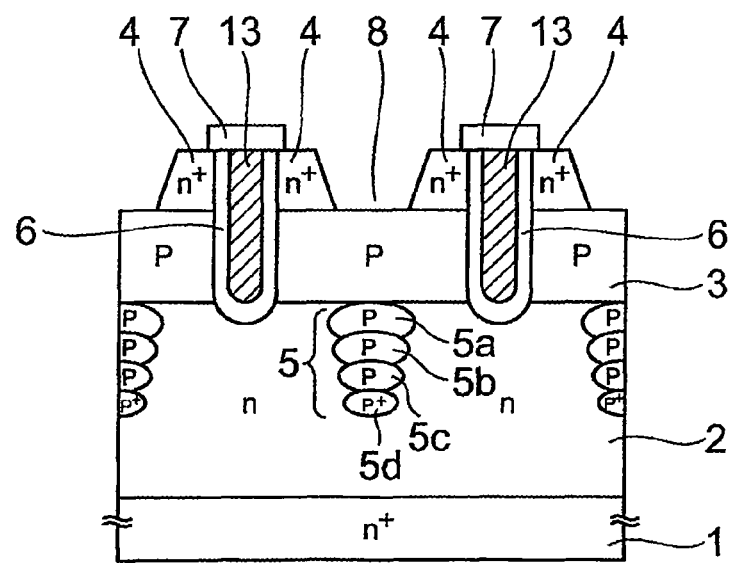

Next, FIGS. 3 are process sectional views showing the method for producing a semiconductor device according to the first embodiment.

First, on the main surface of the $n^+$-type drain layer (or semiconductor substrate) 1, a n-type drift layer 2 is epitaxially grown, and then, p-type impurity is introduced selectively into the surface part of the drift layer 2 to form the p-type base layer 3.

Next, the trench T passing through the base layer 3 and reaching the drift layer 2 from the surface of the base layer 3 is formed, and then, the gate insulator film 6 is formed in the trench T and the gate electrode 13 is buried in the trench T.

Next, the n-type impurity is introduced selectively into the surface part of the base layer 3 and the n+-type source layer 4 is formed, and then, the contact groove 8 passing through the source layer 4 and reaching the base layer 3 is formed. In this case, the inner wall surface of the contact groove 8 (side surface of the source layer 4 facing to the contact groove 8) is inclined. Specifically, the contact groove is first formed by anisotropic etching by a mask whose width is narrow, and then, the mask is etch-backed, and anisotropic etching is performed by a mask whose width is wider than that of the groove. This is repeated at several times, and thereby, the contact groove 8 with inclination is formed.

Next, as shown in FIG. 3B, p-type impurity (such as boron) is introduced (implanted) into the drift layer 2 so that the source layer 4 in which the contact grooves 8 are selectively formed serves as a mask. The impurity introduction (ion implantation) is performed by a plurality of times sequentially from the first introduction position for forming the lowermost portion 5d of the p-type pillar layer 5 to the shallower position of the base layer 3 side.

First, the ion implantation is performed in the first introduction position for forming the lowermost portion 5d, and then, the second ion implantation for forming the impurity diffusion layer 5c in the shallower position than the first introduction position is performed, and next, third ion implantation for forming the impurity diffusion layer 5b in the shallower position than the second introduction position is performed, and last, the ion implantation for forming the uppermost portion 5a in the shallowest position is performed. The ion accelerating voltage is set to be higher as the implantation position is deeper.

The dose amount in impurity introduction into the first introduction position is set to be higher than the dose amounts in the second or later impurity introduction into the shallower positions than the first introduction position. Therefore, the impurity concentration of the lowermost portion 5d of the p-type pillar layer 5 becomes higher than those of the other portions 5a to 5c.

In this embodiment, the contact groove 8 is formed so that the width thereof is narrower as the depth thereof is larger, and the side surface of the source layer 4 around the contact groove 8 is formed to be inclined, and therefore, as shown schematically by the arrows in FIG. 3B, in the case of the same accelerating energy, the reaching position of the impurity driven into the inclined surface of the source layer 4 around the contact groove 8 is shallower, by the amount of passing through the source layer 4, than that of the impurity driven into the drift layer 2 from the bottom surface of the contact groove 8 without passing through the source layer 4.

And, the thickness of the lower portion of the inclined surface in the source layer 4 is gradually thicker as the position is more separate to the horizontal direction from the center of the contact groove 8, and therefore, in the inclined surface of the source layer 4, the impurity penetrating downward from the more upper portion has longer passing distance, and therefore, its reaching position is shallower. Therefore, in the lower portion of the inclined surface of the source layer 4, by difference of the impurity reaching positions, such a distribution gradient of the reaching positions as being along the inclined surface is formed.

Therefore, in the shallower position in the drift layer 2 that is nearer to the base layer 3, the implanted impurity exists so as to more spread to the horizontal direction, and therefore, by the heat treatment after the impurity implantation, the impurity diffusion layer more spreads to the horizontal direction in the shallower position, and therefore, even when the dose amount thereof is high in the lowermost portion 5d, the horizontal-direction diffusion in the heat treatment can be suppressed because the implanted impurity exists so as to be limited to the narrower range to the horizontal direction than that of a shallower position.

As a result, the p-type pillar layer 5 comes to have a shape that is thinner in a stepwise manner from the uppermost portion 5a to the lower most portion 5d, and the impurity concentration of the lowermost portion 5d is enhanced and the higher breakdown voltage can be achieved as described above, and therewith, constriction of the current pathway in the drift layer 2 is not caused, and the increase of ON resistance can be suppressed.

Moreover, FIGS. 4A to 4D are process sectional views showing another method for producing a semiconductor device according to the first embodiment.

Also, in this specific example, the p-type pillar layer 5 is formed by the several times of ion implantation from the first introduction position to a shallower position as described above for forming the lowermost portion 5d. In this case, width of the contact groove 18 is made to sequentially spread by the times from the first impurity introduction into the first introduction position to the second, third, and fourth impurity introductions. In this specific example, the width of the contact groove 18 is about constant in the depth direction.

Figure 4A:
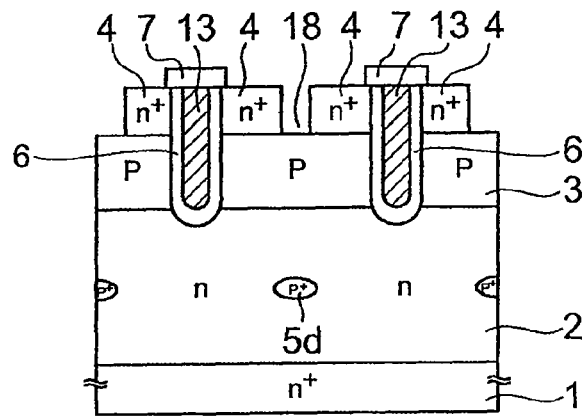
FIGS. 4A to 4D are process cross-sectional views showing another method for producing the semiconductor device according to the first embodiment.

As shown in FIG. 4A, the first ion implantation for forming the lowermost portion 5d is performed in the first introduction position.

Figure 4B:
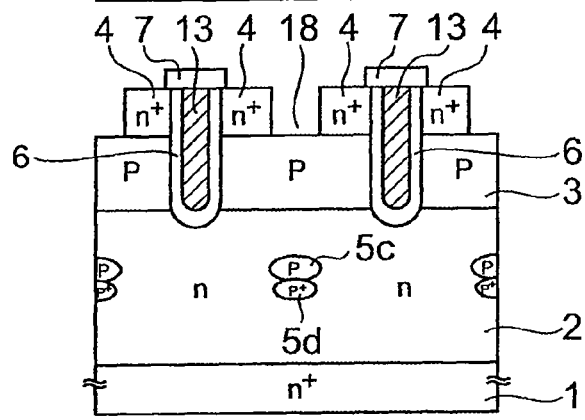

After then, the side surface of the source layer 4 facing to the contact groove 8 is etch-backed to the film surface direction (the horizontal direction that is about parallel to the main surface of the drain layer 1), and as shown in FIG. 4B, in the state that the width of the contact groove 8 is wider than that of the first implantation, the second ion implantation for forming the impurity diffusion layer 5c in a shallower position than the first introduction position is performed.

Figure 4C:
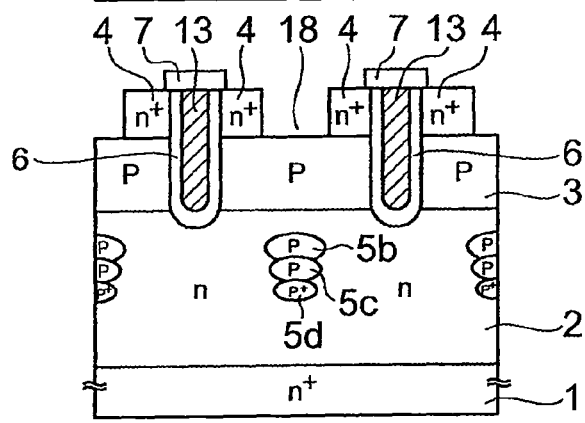

Next, the source layer 4 is further etch-backed, and as shown in FIG. 4C, in the state that the width of the contact groove 8 is wider than that of the second implantation, the third ion implantation for forming the impurity diffusion layer 5b in a shallower position than that of the second implantation is performed.

Figure 4D:
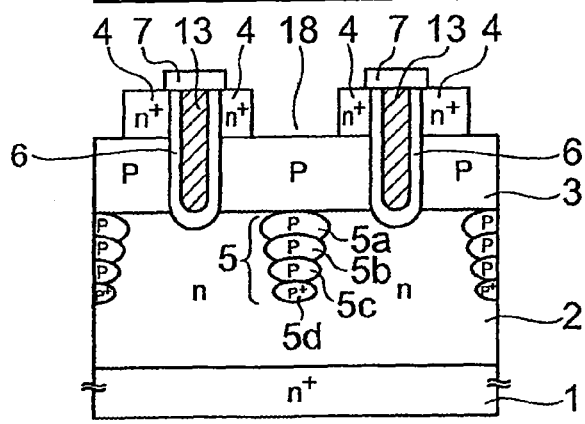

Last, the source layer 4 is further etch-backed, and as shown in FIG. 4D, in the state that the width of the contact groove 8 is wider than that of the third implantation, the ion implantation for forming the uppermost portion 5a in the shallowest position is performed.

The dose amount in the impurity introduction into the first introduction position is higher than the dose amounts in the second or larger impurity introductions into the shallower positions than the first introduction position. Therefore, the impurity concentration of the lowermost portion 5d of the p-type pillar layer 5 is set to be higher than those of the other portions 5a to 5c.

In this specific example, the opening width of the mask comes to more spread by the times of ion implantation from the deep position to the shallow position, and therefore, in the shallower position nearer to the base layer 3 in the drift layer 2, the implanted impurity exists so as to more spread to the horizontal direction, and accordingly, by the heat treatment after the impurity implantation, the impurity diffusion layer comes to more spread to the horizontal direction in the shallower position, and even when the dose amount is higher in the lowermost portion 5d, the implanted impurity exist so as to be limited to the narrower range to the horizontal direction than those of the shallower positions. Therefore, the horizontal-direction diffusion in the heat treatment can be suppressed.

As a result, also in this specific example, the p-type pillar layer 5 has a shape that is thinner in a stepwise manner from the uppermost portion 5a to the lowermost portion 5d, and the impurity concentration of the lowermost portion 5d is enhanced and the higher breakdown voltage can be achieved as described above, and therewith, constriction of the current pathway in the drift layer 2 is not caused, and the increase of ON resistance can be suppressed.

Second Embodiment

Figure 5:
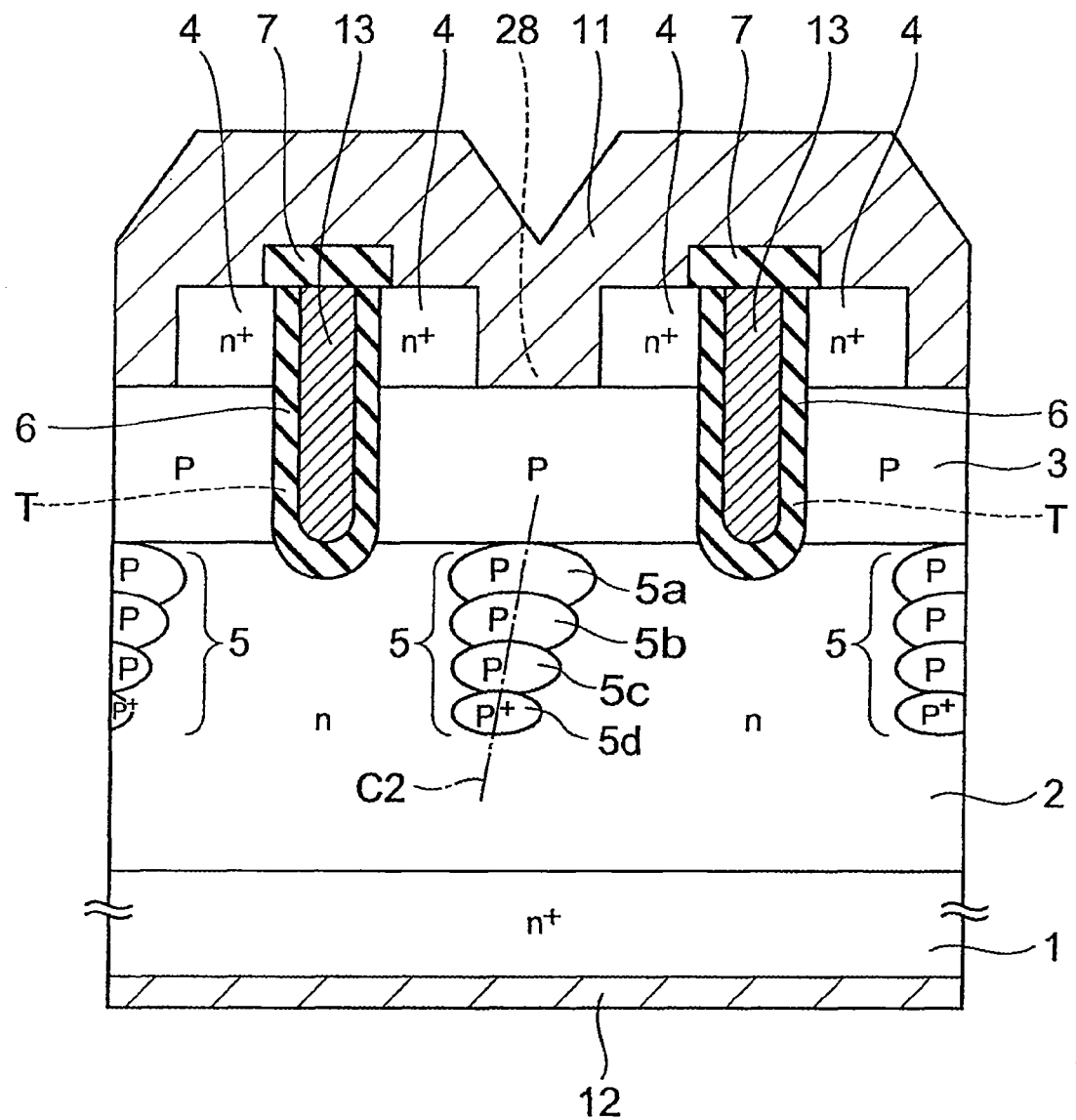
FIG. 5 is a schematic view showing a sectional structure of a semiconductor device according to a second embodiment of the invention.

FIG. 5 is a schematic view showing a sectional structure of the semiconductor device according to a second embodiment of this invention. The same signs will be appended to the same components as the above-described first embodiments, and the detailed explanation thereof will be omitted.

Also in this embodiment, in an interior portion of the drift layer 2 corresponding to a part under a contact groove 28 between the contiguous gate electrodes 13, the p-type pillar layer 5 is provided.

In the first embodiment shown in the above-described FIG. 1, a central line C1 connecting each of the centers of the impurity diffusion layers 5a to 5d in the film-thickness direction composing the p-type pillar layer 5 is about perpendicular to the main surface of the drain layer 1, and the p-type pillar layer 5 has a rotational symmetry with respect to the central line C1.

By contrast, in the second embodiment shown in FIG. 5, a central line C2 connecting each of the centers of the impurity diffusion layers 5a to 5d in the film-thickness direction is inclined from the about perpendicular direction to the main surface of the drain layer 1, and the p-type pillar layer 5 is of rotational asymmetry with respect to the central line C2.

Also in this embodiment, p-type impurity (such as boron) is introduced (implanted) into the drift layer 2 so that the source layer 4 in which the contact grooves 28 are selectively formed serves as a mask. The impurity introduction (ion implantation) is performed by a plurality of times sequentially from the first introduction position for forming the lowermost portion 5d of the p-type pillar layer 5 to the shallower position of the base layer 3 side. Moreover, in this embodiment, the width of the contact groove 28 is about constant in the depth direction. That is, the side surface facing to the contact groove 28 in the source layer 4 is not inclined.

Also, in this embodiment, the dose amount in the impurity introduction into the first introduction position is set to be higher than the dose amounts of the second or later impurity introductions into shallower positions than the first introduction position. Accordingly, the impurity concentration of the lowermost portion 5d of the p-type pillar layer 5 is higher than those of the other portions 5a to 5c.

Figure 6:
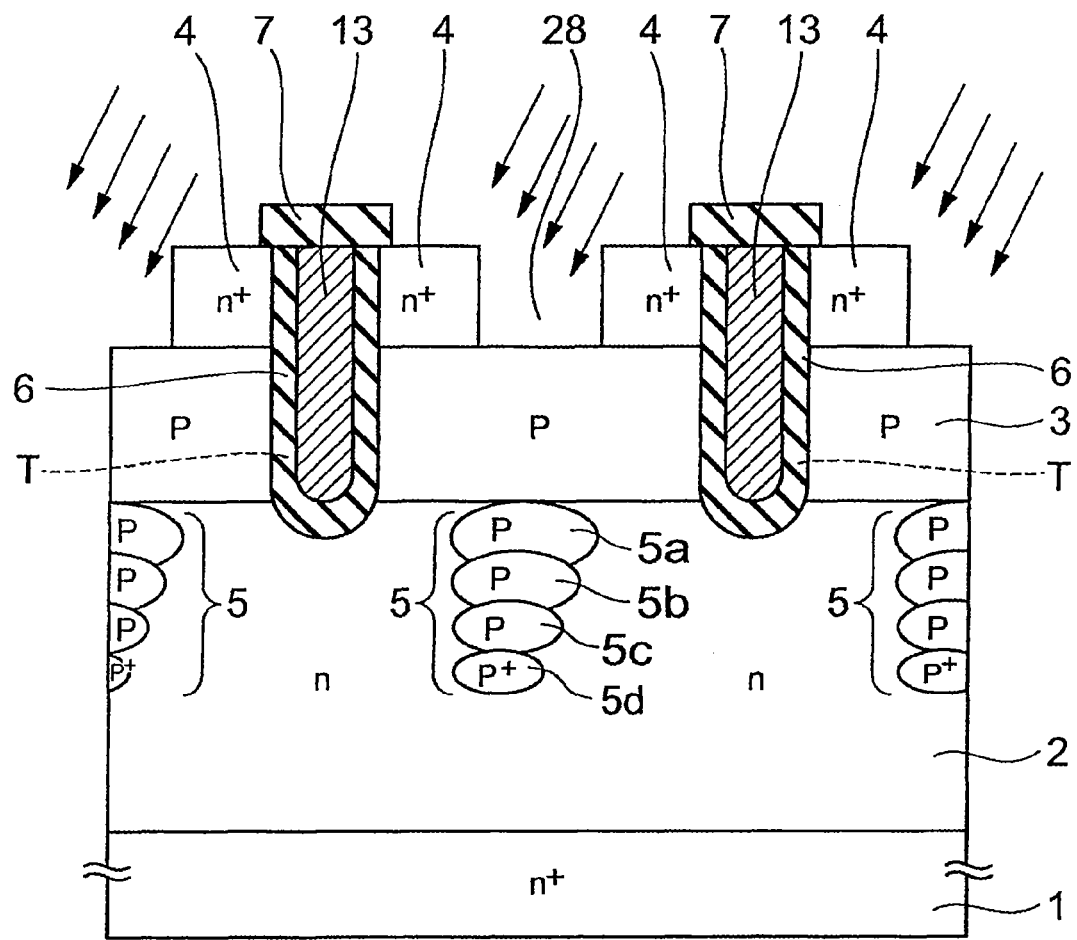
FIG. 6 is a process cross-sectional view showing a method for producing the semiconductor device according to the second embodiment.

And, in this embodiment, in the ion implantation, as the ion-driven direction is schematically shown by the arrows in FIG. 6, the ion implantation is performed from the inclined direction with respect to both directions of the parallel direction and the perpendicular direction to the main surface of the drain layer 1. Thereby, the ion is driven into the bottom surface of the contact groove 28 and into the side surface of the source layer 4 facing to the incidence direction side out of the source layer 4 around the contact groove 28 (the side surface of the source layer 4 in the left side of the contact groove 28), and the side surface of the source layer 4 serves as a mask, and the shape becomes that the source layer 4 side (left side in FIG. 6) of the p-type pillar layer 5 is not inclined and the lower portion of the source layer 4 side of the opposite thereto (right side in FIG. 6) is inclined because the directly downward ion implantation is limited. Therefore, also in this embodiment, the p-type pillar layer 5 having a shape that is thinner in a stepwise manner from the uppermost portion 5a to the lowermost portion 5d can be obtained.

As a result, the impurity concentration of the lowermost portion 5d of the p-type pillar layer 5 is enhanced and the higher breakdown voltage can be achieved as described above, and therewith, constriction of the current pathway in the drift layer 2 is not caused, and the increase of ON resistance can be suppressed.

Third Embodiment

Figure 7:
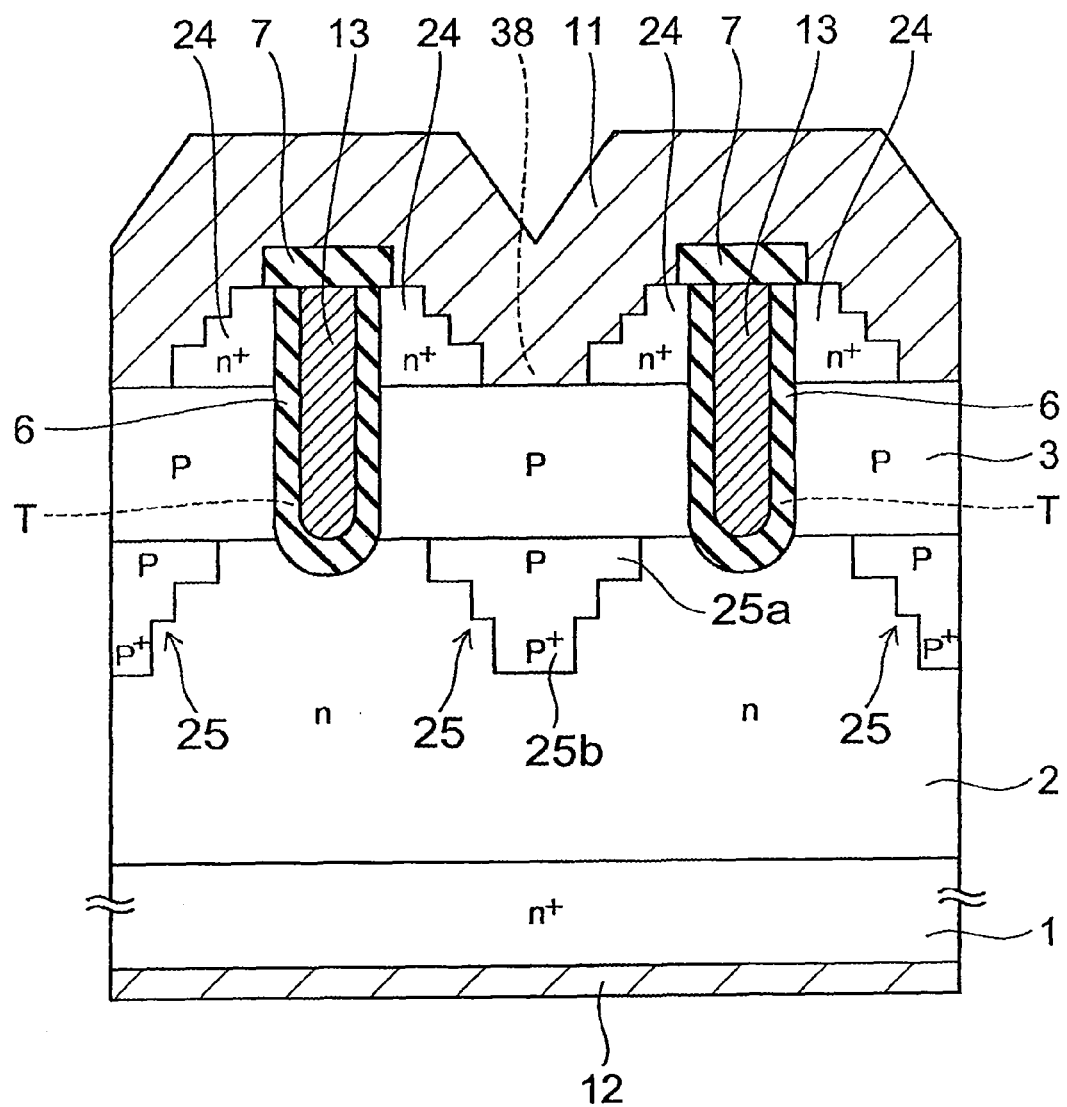
FIG. 7 is a schematic view showing a sectional structure of a semiconductor device according to a third embodiment of the invention.

FIG. 7 is a schematic view showing a sectional structure of the semiconductor device according to a third embodiment of this invention. The same signs will be appended to the same components as the above-described first embodiments, and the detailed explanation thereof will be omitted.

Also in this embodiment, in an interior portion of the drift layer 2 corresponding to a part under a contact groove 38 between the contiguous gate electrodes 13, a p-type pillar layer 25 is provided.

The p-type pillar layer 25 is formed by a plurality of times of implantation of p-type impurity (such as boron) and heat treatment after the implantation before forming the source electrode 11 so that a source layer 24 and the trench gate structure in which the contact grooves 38 are selectively formed serve as a mask.

The side portion of the source layer 24 facing to the contact portion 38 is formed in a stair-like pattern, and the width of the contact groove 38 is formed so as to be narrower in a stepwise manner as the depth thereof larger from the front surface side to the base layer 3 side, and consistently with this shape, the p-type pillar layer 25 has a shape that is thinner in a stepwise manner from an uppermost portion 25a contacting the base layer 3 to a lowermost portion 25b.

The lowermost portion 25b of the p-type pillar layer 25 is located in the drift layer 2 and is not in contact with the drain layer 1, and the drift layer 2 exists between the lowermost portion 25b of the p-type pillar layer 25 and the drain layer 1. Moreover, the lowermost portion 25b of the p-type pillar layer 25 has a higher impurity concentration than that of the other portion in the p-type pillar layer 25.

FIGS. 8A to 8D are process sectional views showing another method for producing a semiconductor device according to the third embodiment.

In the same method as the first embodiment as described above, each of the semiconductor layers and the trench gate structure are formed, and then, the contact groove 38 passing through the source layer 24 and reaching the base layer 3 is formed. In this case, the side portions of the source layer 24 functioning as the inner circumferential walls are made to be in a stair-like pattern, and the width of the contact groove 38 is made to be narrower as the depth thereof is larger to the base layer 3. Specifically, first, the contact groove is formed by anisotropic etching by a mask whose width is narrow, and then, the mask is etch-backed, and anisotropic etching is performed by a mask whose width is larger than that of the groove. This is repeated by several times to form the contact groove 38 having a stair-like pattern.

Figure 8A:
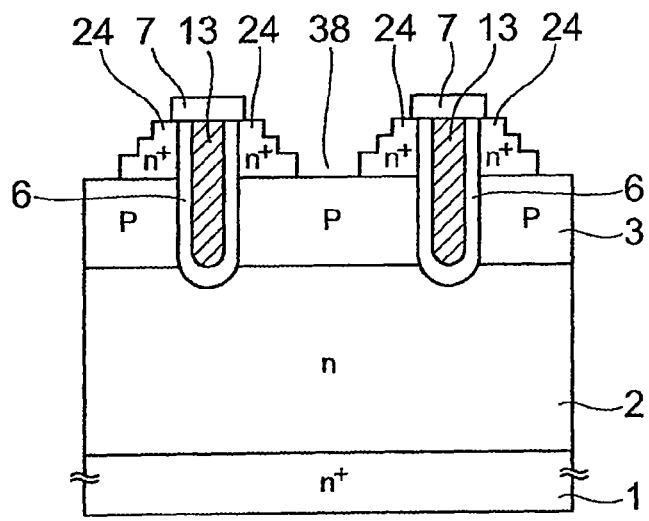
FIGS. 8A to 8C are process cross-sectional views showing a method for producing the semiconductor device according to the third embodiment.
Figure 8B:
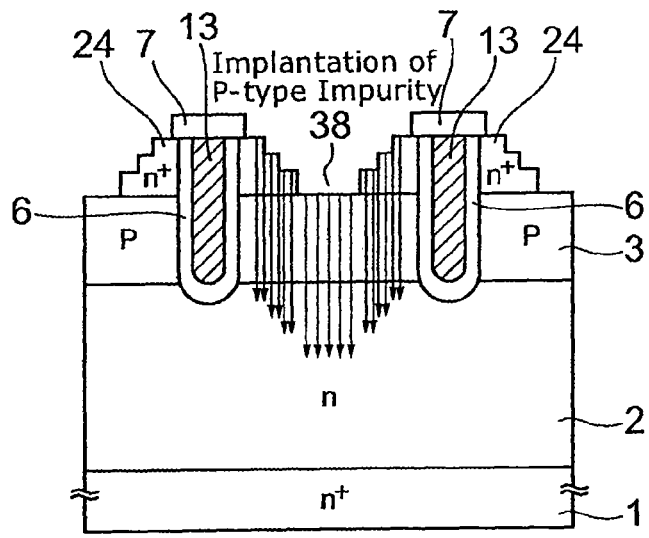
Figure 8C:
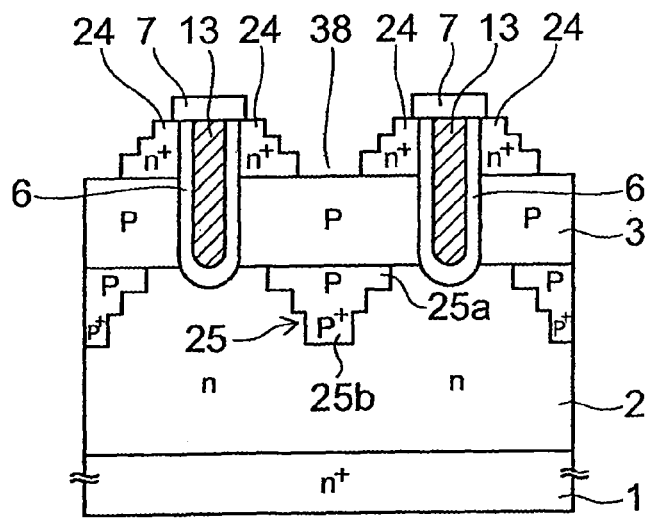

Next, as shown in FIG. 8B, p-type impurity (such as boron) is introduced (implanted) into the drift layer 2 so that the source layer 24 in which the contact grooves 38 are selectively formed serves as a mask.

In this case, the contact groove 38 is formed so that width thereof is narrower as the depth thereof is larger, and the side portion of the source layer 24 around the contact groove is formed in a stair-like pattern, and therefore, as schematically shown by arrows in FIG. 8B, in the case of the same accelerating energy, the reaching position of the impurity driven into the source layer 24 around the contact groove 38 is shallower, by the amount of passing through the source layer 24, than that of the impurity driven into the drift layer 2 from the bottom surface of the contact groove 38 without passing through the source layer 24.

And, the thickness of the source layer 24 around the contact groove 38 is thicker in a stepwise manner as the position is more separate to the horizontal direction from the center of the contact groove 38, and therefore, in the stair-like portion of the source layer 24, the impurity penetrating downward from the more upper portion has longer passing distance, and therefore, its reaching position is shallower. Therefore, in the lower portion of the stair-like portion of the source layer 24, a distribution gradient of the reaching positions by difference of the impurity reaching positions is formed.

Therefore, in the shallower position in the drift layer 2 that is nearer to the base layer 3, the implanted impurity exists so as to more spread to the horizontal direction, and therefore, by the heat treatment after the impurity implantation, the impurity diffusion layer more spreads to the horizontal direction in the shallower position, and therefore, even when the dose amount thereof is high in the lowermost portion 25b, the horizontal-direction diffusion in the heat treatment can be suppressed because the implanted impurity exists so as to be limited to the narrower range to the horizontal direction than that of a shallower position.

As a result, the p-type pillar layer 25 comes to have a shape that is thinner in a stepwise manner from the uppermost portion 25a to the lower most portion 25b, and the impurity concentration of the lowermost portion 25b is enhanced and the higher breakdown voltage can be achieved as described above, and therewith, constriction of the current pathway in the drift layer 2 is not caused, and the increase of ON resistance can be suppressed.

As described above, the embodiments of this invention has been explained with reference to specific examples. However, this invention is not limited thereto but various modifications base on the technical idea of this invention are possible.

In the above-described embodiment, the explanation is performed by setting the first conductivity type to be n type and the second conductivity type to be p type. However, when the first conductivity type is p type and the second conductivity type is n type, this invention can be carried out.

Moreover, this invention can be applied to another vertical semiconductor device such as IGBT (Insulated Gate Bipolar Transistor) as well as MOSFET.

Moreover, for the semiconductor, not only silicon but also, for example, silicon carbide (SiC), Gallium nitride (GaN), and so forth can be used.

The invention claimed is:

1. A method for producing a semiconductor device, comprising:

forming a first trench gate structure and a second trench gate structure in a plurality of semiconductor layers including a first semiconductor layer of a first conductivity type, a second semiconductor layer of the first conductivity type on the first semiconductor layer, a third semiconductor layer of a second conductivity type on the second semiconductor layer, and a fourth semiconductor layer of the first conductivity type on the third semiconductor layer, the second semiconductor layer having a first conductivity type impurity concentration that is lower than a first conductivity type impurity concentration of the first semiconductor layer, the first and second trench gate structures extending along a first direction from a first surface of the fourth semiconductor through the third semiconductor layer and reaching the second semiconductor layer and being spaced from each other along a second direction that is parallel to the first surface and crossing the first direction;

forming a contact groove passing through the fourth semiconductor layer between the first and second trench gate structures and reaching the third semiconductor layer, the contact groove having a width along the second direction, that narrows with increasing distance along the first direction into the fourth semiconductor layer; and forming a fifth semiconductor layer in the second semiconductor layer by introducing an impurity of the second conductivity type through the contact groove and the fourth semiconductor layer to a plurality of introduction positions spaced along the first direction within the second semiconductor layer, the introducing occurring in a sequence such that each introduction position in the sequence is at a distance from the first semiconductor layer that is greater than any preceding introduction position within the sequence, the fourth semiconductor layer, in which the contact groove is formed, serving as a mask during the introducing of the impurity of the second conductivity type to the plurality of introduction positions, the fifth semiconductor layer having a first portion and a second portion that is closer along the first direction to the first semiconductor layer than is the first portion, the first portion being wider along the second direction than the second portion, and a dose amount at a first introduction position in the sequence of the introducing of the impurity of the second conductivity type being higher than a dose amount at any subsequent introduction position in the sequence.

2. The method for producing a semiconductor device according to claim 1, wherein a width along the second direction of the fifth semiconductor layer decreases in a stepwise manner along the first direction.

3. The method for producing a semiconductor device according to claim 1, wherein the width of the contact groove is narrowed continuously.

4. The method for producing a semiconductor device according to claim 1, wherein the width of the contact groove is narrowed in a stepwise manner.

5. The method for producing a semiconductor device according to claim 1, wherein the introducing of the impurity of the second conductivity type at the plurality of introduction positions is performed by ion implantation.

6. The method for producing a semiconductor device according to claim 5, wherein the implanted impurity more largely diffuses to the horizontal direction as the position implanted is shallower.

7. The method for producing a semiconductor device according to claim 5, further comprising diffusing the implanted impurity by heat treatment after the sequence of the introducing of the impurity of the second conductivity type at the plurality of introduction positions is performed by ion implantation, but not during the sequence.

* * * * *